US009910472B1

(12) United States Patent
Wishman et al.

(10) Patent No.: US 9,910,472 B1
(45) Date of Patent: Mar. 6, 2018

(54) POWER SYSTEM CONFIGURATION MONITORING

(71) Applicant: Amazon Technologies, Inc., Seattle, WA (US)

(72) Inventors: Max Jesse Wishman, Seattle, WA (US); Christopher Nathan Watson, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 0 days.

(21) Appl. No.: 14/737,470

(22) Filed: Jun. 11, 2015

(51) Int. Cl.
*G06F 9/00* (2006.01)
*G06F 1/30* (2006.01)
*G06F 1/26* (2006.01)

(52) U.S. Cl.
CPC ................ *G06F 1/30* (2013.01); *G06F 1/263* (2013.01)

(58) Field of Classification Search
CPC .................................. G06F 1/30; G06F 1/263
USPC ........ 713/300, 330, 322, 340, 310; 700/297, 700/293; 714/14; 716/4; 323/304; 370/244, 464, 389
See application file for complete search history.

(56) References Cited

U.S. PATENT DOCUMENTS

| | | | | |
|---|---|---|---|---|
| 6,952,785 B1* | 10/2005 | Diab | ........................ | G06F 1/26 370/244 |
| 7,353,415 B2* | 4/2008 | Zaretsky | ................... | G06F 1/26 713/300 |
| 8,726,045 B2* | 5/2014 | Goodrum | ................ | H04L 12/10 700/297 |
| 2003/0135766 A1* | 7/2003 | Zyskowski | ............. | G06F 1/266 713/300 |
| 2004/0041697 A1* | 3/2004 | Nattkemper | ............... | G06F 1/28 370/464 |
| 2005/0071690 A1* | 3/2005 | Pomaranski | ............ | G06F 1/263 713/300 |
| 2005/0262364 A1* | 11/2005 | Diab | ........................ | H04L 12/10 713/300 |
| 2005/0286624 A1* | 12/2005 | Park | ................... | H03H 21/0012 375/232 |

(Continued)

OTHER PUBLICATIONS

U.S. Appl. No. 15/197,570, filed Jun. 29, 2016, Peter George Ross, et al.

*Primary Examiner* — Aurel Prifti
(74) *Attorney, Agent, or Firm* — Robert C. Kowert; Meyertons, Hood, Kivlin, Kowert & Goetzel, P.C.

(57) ABSTRACT

A power monitoring system monitors the actual configurations of power distribution systems which supply power to computer systems, based on data signals received at the computer systems via the power lines from the power distribution systems. The system determines if an actual power system configuration of a computer system is distinct from a target power system configuration of the computer system. A target configuration can be associated with particular computing operations performed on the computer system and can specify particular power system configurations of computer systems which execute such computing operations. The system can, in response to a determined distinction, adjustably control computing operation execution on the computer system, including adjustably routing data traffic. The system can, in response to a determined distinction, command power distribution system adjustments which mitigate the distinction.

20 Claims, 7 Drawing Sheets

(56) References Cited

U.S. PATENT DOCUMENTS

| | | | |
|---|---|---|---|
| 2006/0041767 A1* | 2/2006 | Maxwell | G06F 1/3209 713/323 |
| 2006/0133368 A1* | 6/2006 | Tolliver | G06F 1/266 370/389 |
| 2006/0143583 A1* | 6/2006 | Diab | G06F 1/189 713/300 |
| 2007/0070566 A1* | 3/2007 | Campini | G06F 1/26 361/90 |
| 2008/0168283 A1* | 7/2008 | Penning | G06F 1/263 713/310 |
| 2008/0249666 A1* | 10/2008 | Buterbaugh | G06F 1/28 700/293 |
| 2009/0001956 A1* | 1/2009 | Velez | H04L 12/10 323/304 |
| 2009/0119523 A1* | 5/2009 | Totten | G06F 1/32 713/322 |
| 2009/0271642 A1* | 10/2009 | Cheng | G06F 1/263 713/300 |
| 2010/0058091 A1* | 3/2010 | Lambert | G06F 1/263 713/330 |
| 2011/0066865 A1* | 3/2011 | Bandholz | G06Q 90/00 713/300 |
| 2012/0110350 A1* | 5/2012 | Horvath | G06F 1/263 713/300 |
| 2015/0121113 A1* | 4/2015 | Ramamurthy | H02J 9/061 713/340 |
| 2015/0177813 A1* | 6/2015 | Bailey | G06F 1/3234 713/320 |
| 2015/0244536 A1* | 8/2015 | Ma | G06F 1/263 713/300 |
| 2015/0355699 A1* | 12/2015 | Castro-Leon | G06F 1/30 713/322 |
| 2015/0370301 A1* | 12/2015 | Bolan | G06F 1/263 713/322 |
| 2016/0026549 A1* | 1/2016 | Alshinnawi | G06F 11/2015 714/14 |
| 2016/0064938 A1* | 3/2016 | Balasubramanian | H04L 12/10 307/11 |
| 2016/0118802 A1* | 4/2016 | Castillo | H02J 9/06 307/18 |
| 2017/0199794 A1* | 7/2017 | Byers | G06F 11/2015 |

* cited by examiner

POWER SYSTEM CONFIGURATION MONITORING

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

Some data centers include computer systems which are configured to receive power support from one or more various power distribution systems. Various power distribution systems can be configured to provide various power support redundancies, supply power from various power sources, etc.

Some data centers include back-up components and systems to provide back-up power to servers in the event of a failure of components or systems in a primary power system. In some data centers, a primary power system may have its own back-up system that is fully redundant at all levels of the power system. Such a level of redundancy for the systems and components supported by the primary and fully-redundant back-up system may be referred to as "2N" redundancy. For example, in a data center having multiple server rooms, one or more server racks may receive power support from a primary power system and fully-redundant back-up power system. The back-up system for each server room may have a switchboard, uninterruptible power supply (UPS), and floor power distribution unit (PDU) that mirrors a corresponding switchboard, uninterruptible power supply, and floor power distribution unit in the primary power system for that server room.

Some data centers may include a back-up system that is less than fully redundant for a primary power system. Such a level of redundancy for the systems and components supported by the primary and fully-redundant back-up system may be referred to as "N+1" redundancy. While N+1 redundancy may not provide fully-redundant reserve power support for computing equipment, such redundancy may involve lower capital and operating costs.

In some data centers, some sets of computing equipment may be configured for power support of various types of redundancy. For example, some server racks may receive 2N reserve power support, some server racks may receive N+1 reserve power support, and some server racks may receive a concurrent supply of power from one or more separate power feeds independently of an upstream transfer switch.

Figure 1:
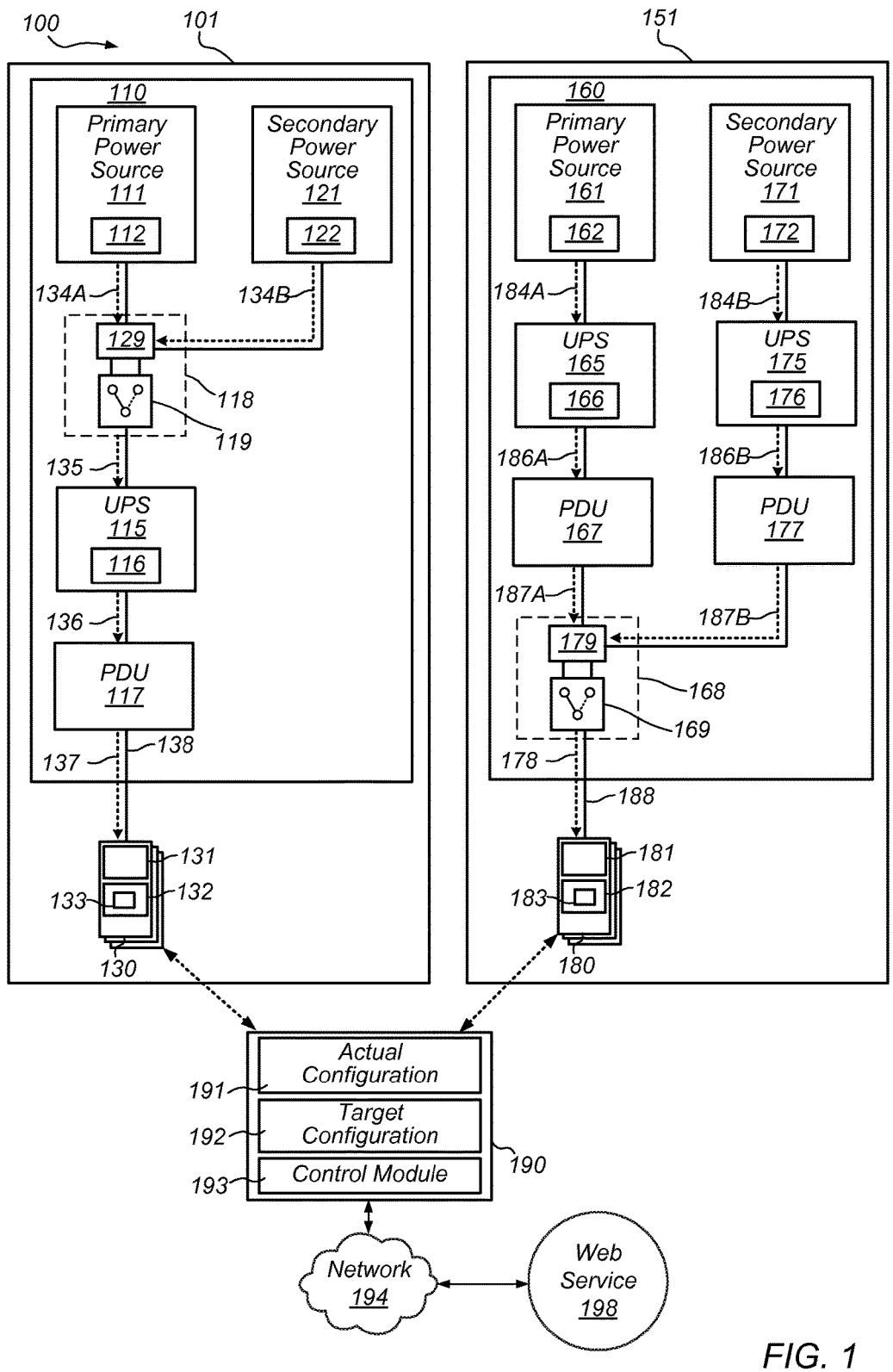
FIG. 1 is a schematic diagram illustrating a power monitoring system which monitors power system configurations of various computer systems in various availability zones, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of systems, apparatuses and methods for adjustably controlling computing operation execution and data traffic in association with various computer systems, based on monitoring power system configurations of the computer systems via data signals from one or more power distribution system components which are received at the computer systems via one or more power transmission lines, are disclosed.

According to one embodiment, a data center includes a power distribution system configured to supply electrical power from a selected one of a plurality of power sources, one or more sets of computer systems configured to consume electrical power supplied by the power distribution system via the power transmission line and perform one or more sets of computing operations based at least in part upon the consumed electrical power, and a power monitoring system. The power distribution system includes a primary power feed which carries power supplied by a primary power source, a secondary power feed which carries power supplied by a secondary power source, at least one power distribution component configured to selectively supply power from a selected one of the primary power feed and the secondary power feed, and a power transmission line configured to carry the selectively supplied power. The power distribution system is configured to communicate one or more data signals, indicating a configuration of one or more portions of the power distribution system, via the power transmission line. The power monitoring systems are configured to determine that an actual configuration of the power distribution system supplying power to the one or more sets of computer systems is distinct from a target configuration, of the power distribution system, which is associated with the one or more sets of computer systems, based on processing data signals received from the power distribution system via the power transmission line.

According to one embodiment, a system include a power monitoring system, implemented on one or more computer systems, which is configured to associate a target power system configuration with at least one computer system, determine an actual power system configuration of the at least one computer system, and determine that the actual power system configuration of the at least one computer system is distinct from the target power system configuration of the at least one computer system. The target power system configuration specifies a target configuration of at least one power distribution system which supplies power to the at least one computer system via a power transmission line. The actual power system configuration specifies an actual configuration of the at least one power distribution system, based on processing at least one data signal received at the at least one computer system from the at least one power distribution system via the power transmission line.

According to one embodiment, a method includes performing, by one or more computer system, associating a target power system configuration with at least one computer system, determining an actual power system configuration of the at least one computer system which specifies an actual configuration of the at least one power distribution system, and determining that the actual power system configuration of the at least one computer system is distinct from the target power system configuration of the at least one computer system. The actual power system configuration specifies an actual configuration of the at least one power distribution system, based on processing at least one data signal received at the at least one computer system from the at least one power distribution system via the power transmission line.

As used herein, one component in a power distribution system is "downstream" from another component in the power distribution system if the one component receives power from the other component or is at a lower level in the power distribution system than the other component. For example, a floor PDU may be downstream from a UPS, or a power supply unit in a server may be downstream from a rack PDU.

As used herein, a "power component", in the context of a power distribution system, means a component, device, or system that supplies power to one or more other components, devices, systems, or loads in a system. Examples of power components in a power distribution system include a power supply unit, a power supply module, a rack PDU, a floor PDU, a UPS, a power bus, a backfeed apparatus, a distribution panel, a generator, or a transformer.

As used herein, "power transmission line" means a line that transmits power from one component to another component. Examples of power transmission lines include conductors that carry power from a UPS to a floor PDU, conductors that carry power from a floor PDU to an automatic transfer switch ("ATS"), conductors that carry power from an automatic transfer switch to a rack PDU, and conductors that carry power from a rack PDU to a server power supply unit. Power transmission lines may have any form, such as a cable, bus bar, or other conductive member or device.

As used herein, "signal" includes any signal, message, pulse, wave, or combination thereof, that can provide information from one element to another element. A signal may serve to indicate, identify, inform, direct, instruct, command, or warn. A signal may be a discrete set of information (for example, a sequence of characters in a message), continuous (such as a wave), periodic, or a combination thereof. In some cases, a signal is a message having a predetermined format or arrangement, such as a sequence of characters (for example, a message representing the string PWRID0002436). In some embodiments, a signal includes an identifying address of the device sending the signal. In some embodiments, a signal includes information about characteristics or conditions of some or all of a component, device, or system, including information indicating a current state of such characteristics or conditions.

As used herein, one component in a power distribution system is "upstream" from another component in the power distribution system if the one component supplies power to the other component or is at a higher level in the power distribution system than the other component. For example, a UPS may be upstream from a floor PDU, or a rack PDU may be upstream from a power supply unit for a server.

As used herein, "power distribution unit" means any device, module, component, or combination thereof, that can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.). A power distribution unit may include a transformer, power monitoring, fault detection, and isolation.

As used herein, "floor power distribution unit" refers to a power distribution unit that can distribute electrical power to various components in a computer room. In certain embodiments, a floor power distribution unit includes a transformer. In one embodiment, a floor power distribution unit includes a k-rated transformer. A power distribution unit may be housed in an enclosure, such as a cabinet.

As used herein, "rack power distribution unit" refers to a power distribution unit that can be used to distribute electrical power to various components in a rack. A rack power distribution may include various components and elements, including wiring, bus bars, connectors, and circuit breakers. In some embodiments, a rack power distribution unit may distribute power to only some of the electrical systems in a rack. In some embodiments, a single rack includes two or more rack power distribution units that distribute power to different sets of electrical systems in the rack. For example, one rack may include a left rack power distribution unit that distributes power to half of the servers in the rack, and a right rack power distribution unit that distributes power to the other half of the servers in the rack.

As used herein, a "cable" includes any cable, conduit, or line that carries one or more conductors and that is flexible over at least a portion of its length. A cable may include a connector portion, such as a plug, at one or more of its ends.

As used herein, "computing operation" includes any operation that can be performed by a computer, such as computation, data storage, data retrieval, or communications.

As used herein, "computer room" means a room of a building in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, "primary power" means any power that can be supplied to an electrical load, for example, during normal operating conditions. A power distribution system (also referred to herein as a "power system") that distributes primary power may be referred to as a primary power system.

As used herein, a "rack" means a rack, container, frame, or other element or combination of elements that can contain or physically support one or more computing devices.

As used herein, "secondary power" means power that can be supplied to an electrical load in addition to, upon the failure of, or as a substitute for, primary power to the load. In some embodiments, secondary power includes reserve power supplied from one or more reserve power sources, back-up power sources, some combination thereof, or the like.

As used herein, providing power "support" refers to providing one or more power feeds to be available to one or more downstream systems and components, including one or more electrical loads. Such provided power feeds may be precluded from being received by the systems and components but may be made available for receipt based at least in part upon a positioning of one or more components upstream of the systems and components. For example, a secondary power system may provide secondary power support to an electrical load by providing a secondary power feed that can be selectively routed to the load by a transfer switch that is downstream of the secondary power system and upstream of the load, where the transfer switch may selectively route the secondary power feed or a primary power feed to the load based at least in part upon one or more conditions associated with the primary power feed.

FIG. 1 is a schematic diagram illustrating a power monitoring system which monitors power system configurations of various computer systems in various availability zones, according to some embodiments.

System 100 includes separate availability zones 101, 151 in which separate sets of computer systems 130, 180 are included with separate sets of power distribution systems 110, 160. System can include an individual data center in which the availability zones 101, 151 are both located, a collection of separate data centers in which the availability zones 101, 151 are separately located, some combination thereof, etc.

As referred to herein, an availability zone includes at least a set of computer systems, in one or more data centers, which can be affected by a fault in a given power distribution system which provides power support to the set of computer systems. In some embodiments, an availability zone includes both the set of computer systems which can be affected by a fault in a given power distribution system and the given power distribution system itself. Separate sets of computer systems which are coupled to, and receive power from, separate power distribution systems are thus located in separate availability zones, as the effects of a failure of a power distribution system in one availability zone can be restricted to the computer systems supplied power by the power distribution system while computer systems supplied power by another power distribution system in another availability zone are not affected. As referred to herein, a set of computer systems can include one or more computer systems, networking devices, electronic devices, some combination thereof, etc.

As shown, each availability zone 101, 151 includes a separate set of power distribution systems 110, 160. As shown, zone 101 includes a power distribution system 110 which is configured to supply power with an N+1 redundancy, as the system 110 includes a secondary power source 121 which can supply power which is distributed via a chain of power distribution components 118, 115, 117 included in the system 110. The system 110 includes a switchgear 118 which includes a switchgear device 119 that is configured to selectively supply power from one of the sources 111, 121. The system 110 further includes an uninterruptible power supply (UPS) 115 and a power distribution unit (PDU) 117, which can include a floor PDU, a rack PDU, some combination thereof, etc.

In contrast, zone 151 includes a power distribution system 160 which includes parallel sets of power distribution components which supply power from separate power sources 161, 171 to a downstream switchgear 168. Such a system 160 can be referred to as being configured to supply power with a 2N redundancy, as at least some of the power distribution system is replicated, in addition to the power source. It will be appreciated that the power sources included in the separate zones are also separate sets of power sources. As a result, a fault in power sources in one zone is precluded from affecting power support provided to computer systems included in another zone.

In some embodiments, separate availability zones include a common secondary power source and separate primary power sources and power distribution systems. For example, power sources 121 and 171 in system 100 can be a common secondary power source. Because the separate zones 101, 151 include separate primary power sources 111, 161 and separate power distribution systems 110, 160 which supply primary power from the separate sources 111, 161 to the separate sets of computer systems 130, 180 in the separate zones, a power fault in one primary power system 111, 121 is restricted to affecting primary power supply to a set of computer systems in an individual availability zone in which the source 111, 161 is included.

The system 160 includes a primary power source 161, a primary UPS 165 and PDU 167 which supply power from the primary power source, and a secondary power source 121 and secondary UPS 175 and PDU 177 which supply power from the secondary power source. A switchgear 168 which includes a switchgear device 169 and selectively supplies power received from one of the PDUs 167, 177 to the computer systems 180 coupled to system 160.

As a result, the set of computer systems 130 included in zone 101 receive N+1 redundant power from system 110, and the set of computer systems 180 included in zone 151 receive 2N redundant power from system 160, and the separate sets 130, 180 each receive primary power support, via the respective power distribution systems 110, 160, from separate primary power sources 111, 161. The set of computer systems 130 in zone 101 are coupled to system 110 via one or more power transmission lines 138, and the set of computer systems 180 in zone 151 are coupled to system 160 via one or more power transmission lines 188.

In some embodiments, one or more portions of a power distribution system is configured to generate one or more sets of data signals which are communicated downstream through the power distribution system towards the computer systems coupled to the power distribution system via one or more instances of power transmission lines which couple the power distribution components together and via which power is supplied from a power distribution system to a computer system. A power distribution component can be configured to generate a data signal and communicate the data signal via a power transmission line to which the power distribution component is coupled.

As shown, various power distribution components included in the power distribution systems illustrated in FIG. 1 include data signal generators 112, 122, 162, 172, 166, 176, 129, 116, 179. A data signal generator which is included in a power distribution component can generate one or more data signals which include information indicating one or more elements associated with the component, including an identity of the component, a physical configuration of one or more portions of the component, etc. For example, generators 112, 122, 162, 172 can generate data signals which indicate a unique identity of the respective power sources 111, 121, 161, 171. A data signal can include a signal at a particular frequency, tone, waveform, etc. where signals associated with the particular frequency, tone, etc. are predetermined to be associated with a particular power distribution component, including a particular power source.

As a result, a determined presence of a particular data signal generated by a particular one of the power source data signal generators 112, 122, 162, 172 can include information indicating an identity of a particular power source, power distribution component, etc. in which the respective generator is located. As shown in the illustrated embodiment, data signals generated at generators included in a particular component can be communicated downstream through a power distribution system in which the particular component is included, and a downstream device which can detect and process data signals communicated over a power transmission line can determine, based on receiving and processing a data signal received from an upstream power distribution component via a power transmission line, that the downstream device is electrically coupled to the particular component such that power is supplied to the downstream device at least in part via the upstream particular component. Therefore, based on receiving and processing data signals received from upstream via a power transmission line, a device which is configured to detect and process such data signals, which can include a power monitoring system, can determine a configuration of upstream power distribution components, including a configuration of a power distribution system, via which power support is provided to at least the device. Such a determination can be referred to as determining a topology of the power distribution system, determining a power system configuration of the device, determining a power system configuration of a computer system in which the device is included and which is provided power support by the power distribution system, etc.

Determining a power system configuration of a computer system can include determining the identities of power sources which supply power to the computer systems, various power distribution components in the power distribution system which supplies power to the computer system, etc. In some embodiments, a data signal generated at a signal generator included in a power distribution component includes information indicating a present configuration of the component. For example, signals generated by generator 116 included in UPS 115 can include information, including particular tones, signals having one or more particular frequencies, patterns, waveforms, etc. which indicate whether the UPS 115 is charging, discharging, in bypass, etc. In another example, signals generated by generator 129 included in the switchgear 118 can indicate whether the switchgear device 119 is switched to supply power from either a power source coupled to a primary power input of the switchgear 118 or a power source coupled to a secondary power input of the switchgear 118.

System 100 includes a power monitoring system 190 which is communicatively coupled to one or more of the sets of computer systems 130, 180. In some embodiments, a power monitoring system is implemented by one or more computer systems. In some embodiments, at least one power monitoring system is included in at least one computer system of the sets of computer systems 130, 180. A power monitoring system 190 included in a computer system in one of the sets of computer systems can be communicatively coupled to other computer systems in the same set, in other sets of computer systems in system 100, some combination thereof, etc. In some embodiments, system 190 is implemented in one or more computer systems which are remotely located relative to both sets 130 and 180, including computer systems which are located in data centers, facilities, etc. that are separate from data centers, facilities, etc. in which the sets 130, 180 are located, where system 190 is communicatively coupled to computer systems in one or more of the sets 130, 180 via one or more communication networks 194.

In some embodiments, the power monitoring system 190 receives data signals which are communicated 134A-B, 135, 136, 137, 184A-B, 186A-B, 187A-B, 178 through various power transmission lines 138, 188 included in the power distribution systems 110, 160 and to the computer systems 130, 180 to which the systems 110, 160 supply power. The system 190 can be included in one or more of the systems 130, 180. In some embodiments, system 190 is external to one or more of the computer systems 130, 180 and is communicatively coupled to same via one or more communication conduits.

As shown, a set of computer systems 130, 180 can include one or more computer systems 132, 182 and one or more networking devices 131, 181 which communicatively couple the computer systems 132, 182 to one o more communication networks 194. In some embodiments, system 190 is coupled to one or more computer systems and networking devices in a given set 130, 180 of computer systems.

In some embodiments, power monitoring system 190 monitors data signals received at one or more sets of computer systems, via one or more power transmission lines 138, 188, and determines an actual power system configuration of the one or more sets of computer systems 130, 180 based on processing the data signals. A power system configuration of a computer system, set of computer systems, etc. refers to a configuration of the power distribution system which supplies power to the computer system, set of computer systems, etc. Such a configuration can include a topology of the power distribution system, including a hierarchy of the identities and connections of the power distribution components, power sources, etc. in the power distribution system. In addition, the configuration can include the operating states of the various power distribution components, including a switchgear position, a UPS operating state, etc.

As shown, system 190, in some embodiments, monitors the actual power system configurations 191 of multiple separate sets 130, 180 of computer systems. Based on processing signals 137, 178 received at the sets 130, 180 via lines 138, 188, system 190 can determine that the set of computer systems 130 has a power system configuration which comprises power distribution system 110 supplying power to the set 130, where primary power is supplied from power source 111 and secondary power is supplied from power source 121, and where the power redundancy provided by system 110 is N+1 redundancy. The redundancy of the power distribution system can be determined based on determining the topology of the power distribution system, so that system 190 can determine that a power distribution system provides 2N redundancy based on determining that the primary and secondary power supplied to a switchgear is provided via parallel and complete power distribution chains, as shown with regard to power distribution system 160.

In some embodiments, power monitoring system 190 associates one or more sets of computer systems with a particular target power system configuration 192. The target power system configuration includes a particular power system configuration and can comprise a design power system configuration for the computer system, a power system configuration of computer systems which are configured to execute one or more particular sets of computing operations 133, etc. For example, where a power distribution system 110 includes a primary power source 111 and a secondary power source 121, a target power system configuration of a computer system set 130 which is supplied power from the power distribution system 110 includes a configuration of the system 110 where the primary power source 111 is coupled to a primary power input of the switchgear 118 and the secondary power source 121 is coupled to a secondary power input of the switchgear 118.

In some embodiments, a target power system configuration of a set of computer systems is associated with a set of computing operations 133, 183 executed by one or more computer systems included in the set of computer systems. The target power system configuration can specify a configuration of a power distribution system which supplies power to computer systems which execute the set of computing operations. For example, a web service 198 may provide, to system 190 via network 194, with a target power system configuration which specifies that a particular set of computing operations 133 associated with the web service 198 be executed on a set of computer systems which has a certain power system configuration which includes the computer systems being supplied power by a power distribution system which has a certain power redundancy. In another example, a target power system configuration provided to system 190 by web service 198 may specify that a particular set 133, 183 of computing operations associated with the web service 198 be executed, in duplicate, on separate sets 130, 180 of computer systems included in separate availability zones 101, 151.

In some embodiments, power monitoring system 190 compares the actual power system configurations 191 of one or more sets of computer systems with target power system configurations 192 associated with the one or more sets of computer systems and determines whether the actual power system configuration of one or more sets of computer systems are distinct from the corresponding associated target power system configurations. If a distinction is determined, the system 190 can generate a warning signal which is associated with the one or more sets of computer systems and is communicated to various entities via the network 194.

Control module 193 included in the system 190 can identify particular aspects of the distinction and can generate a warning signal which indicates a set of adjustments to one or more power distribution systems which result in mitigating the distinction. For example, where a distinction detected for computer systems 130 comprises a determination that power source 121 is coupled to a primary power input to switchgear 118 and power source 111 is coupled to a secondary power input to switchgear 118, the control module 193 can generate a warning signal which includes instructions to re-configure power system 111 and 121 to be coupled to the primary and secondary power inputs, respectively, of switchgear 118.

In some embodiments, where a target power system configuration associated with a set of computer systems 130 is associated with a set of computing operations 133 executed at the set of computer systems, the control module 193 can, based on determining a distinction associated with the set of computer systems 130, generate a warning signal which is communicated, via network 194, to the one or more web services 198 associated with the set of computing operations 133, where the signal alerts the web service 198 that the set of computing operations 133 associated with the service 198 are being executed on one or more sets of computer systems 130 which are not in compliance with the target power system configuration associated with the set of computing operations 133.

In some embodiments, the control module 193 of the power monitoring system 190 is configured to adjustably control the execution of one or more computing operations on the one or more computer systems, which can include adjustably routing data traffic to one or more various computer systems, from one or more various computer systems, etc., based on a determination that the actual power system configurations of the computer systems is distinct from the target power system configuration of the computer systems. Where the target power system configuration is associated with a set of computing operations, the power monitoring system 190 can adjustably route data traffic to various computer systems to cause the set of computing operations to be executed on a set of computer systems having an actual power system configuration which matches the target power system configuration associated with the set of computing operations. Such routing can include migrating data, computing operations, etc. to one or more other computer systems, replicating data, computing operations, etc. to one or more various computer systems, etc.

For example, where a set of computing operations 133 is associated with a target power system configuration 192 which specifies that the computing operations 133 are to be executed, in parallel, on at least two sets of computer systems 130, 180 located in separate availability zones, and where system 190 determines, based on monitoring data signals received at sets of computer systems 130 and 180, that the computing operations 133 are being executed solely on computer systems 130 included in zone 101, then the power monitoring system 190 can, in response, at least replicate at least some of the computing operations 133 from the set of computer systems 130 to one or more computer systems in the set 180 included in zone 151, so that the computing operations 133 are executed in separate availability zones 101, 151, thereby mitigating a risk of the computing operations 133 being lost, degraded, etc. in the event that a power fault occurs in any individual one of the power sources, power distribution systems, etc. in system 100 are lost.

In some embodiments, power monitoring system 190 adjustably controls computing operation execution based on commands received from a web service 198 associated with the computing operations via network 194. For example, where system 190 generates a warning signal to a web service 198 which informs the web service 198 that associated computing operations 133 are being executed on computer systems 130 which are out of compliance with a target power system configuration associated with the computing operations 133, the system 190 can adjustably control execution of the computing operations 133 based on commands received from the web service 198. For example, system 190 can migrate a set of computing operations 133 from computer systems 130 to computer systems 180 based on a command from web service 198. Such adjustable control of computing operation execution can include routing data traffic away from set 130 and to set 180.

Figure 2:
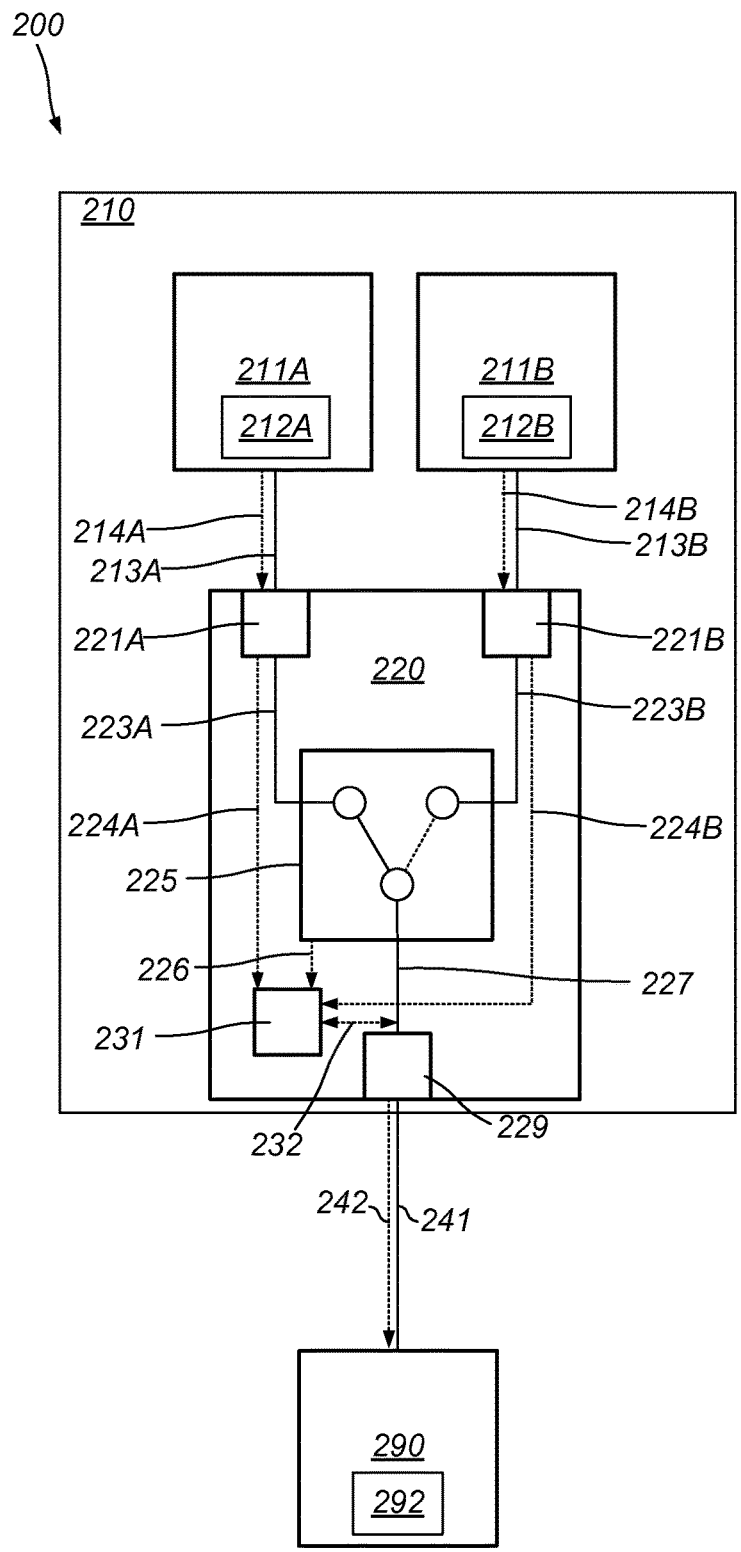
FIG. 2 is a schematic diagram illustrating a power distribution system and a computer system to which the power distribution system supplies power, according to some embodiments.

FIG. 2 is a schematic diagram illustrating a power distribution system and a computer system to which the power distribution system supplies power, according to some embodiments. The power distribution system and computer system can be included in any of the embodiments of power distribution systems and computer systems included herein.

System 200 includes a computer system 290 and a power distribution system 210 which supplies power to the computer system 290 via power transmission line 241, thereby providing power support to the computer system 290 via power transmission line 241. The power distribution system 210 includes a primary power source 211A, a secondary power source 211B, and a switchgear 220 which selectively supplies power from one of the power sources 211A-B to the computer system 290.

As shown, the switchgear 220 includes, in addition to the switchgear device 225 itself, a primary power input 221A, a secondary power input 221B, a power output 229, and lines 223A-B, 227 which couple the inputs and outputs to the switchgear device 225. In some embodiments, the power inputs 221A-B and input lines 223A-B are configured differently, such that the primary power input 221A and line 223A are configured to be supplying power for an extended period of time, relative to the input 221B and line 223B.

Because input 221A and line 223A are associated with a primary power source, the input 221A and line 223A may be expected to be supplying power to computer system 290 more often than input 221B and line 223B. In addition, the primary power source 211A and secondary power source 211B may be configured differently. For example, power source 211B may be configured to supply power to computer system 290 for a limited amount of time, while power source 211A may be configured to supply power to computer system 290 continuously.

As shown, the primary power source 211A is coupled to the primary power input 221A of switchgear 220 via a power feed 213A and the secondary power source 211B is coupled to the secondary power input 221B of switchgear 220 via a separate power feed 213B.

As shown, power sources 211A-B each include a separate data signal generator 212A-B which generates a separate unique data signal 214A-B which is specific to the respective power source in which the respective signal generator is located. For example, the separate data signals 214A-B can comprise separate and unique sets of information, including separate signal tones, frequencies, waveforms, etc. The data signals 214A-B are communicated via the feed lines 213A-B through which the power sources 211A-B are coupled to the respective power inputs 221A-B of the switchgear 220. In some embodiments, where power supplied by a particular power source 211A-B is selectively supplied to the computer system 290 by device 225, the data signals 242 communicated to computer system 290 via line 241 can include data signals 214A-B generated by the respective generator 212A-B included in the particular power source 211. As a result, a power monitoring system 292 included in the computer system 290 can determine, based on processing the received data signals 242, that the power distribution system 210 includes at least the particular power source 211 which is presently supplying power to the computer system 290 via the switchgear 220.

In some embodiments, the switchgear 220 includes a data signal generator 231 which generates one or more data signals 242 which are communicated via the power line 241 to the computer system 290. The generator 231 can be communicatively coupled 224A-B, 226, 232 to the various components 221A-B, 225, 229 of the switchgear 220 and can generate a set of data signals 242 which indicate a configuration of one or more of the components of the switchgear 220. For example, based on communication between the generator 231 and the switchgear device 225, the generator 231 can generate a set of data signals which indicate a switch position of the device 225, indicating whether the device 225 is presently configured to supply power from the primary line 223A or the secondary line 223B. In another example, the generator 231 can, based on communication with the inputs 221A-B, generate data signals indicating information about the power sources 211A-B coupled to the respective inputs.

Data signals 214A-B received at inputs 221A-B can be communicated to generator 231 and can be communicated on 242 to computer system 290. For example, where the switchgear device 225 is presently supplying power from input 221A, such that data signals 214A from generator 214A are included in power supplied to the computer system 290 via line 241, generator 231 can communicate, to computer system 290 via line 241, a data signal 214B which is received from power source 211B at input 221B. The generator 231 can modify signals received from the inputs 221A-B to cause the data signals communicated to the computer system 290 to indicate, in addition to the identity of the separate power sources 211A-B, the specific input 221A-B to which each separate power source is coupled.

Computer system 290 includes a power monitoring system 292 which receives data signals 242 communicated over the power line 241 via which the computer system 290 is supplied power. The system 292 processes the received data signals and can determine a configuration of the various components included in the power distribution system based on the processed data signals, where such a configuration can be referred to as a power system configuration of the computer system 290.

In some embodiments, the system 292 can determine, based on processing data signals 242, an identity of one or more of the power sources which are coupled to specific power inputs 221A-B of the switchgear 220. As a result, the system 292 can determine whether the configuration of system 210 is a configuration where the primary power input 221A is coupled to a power source other than a particular primary power source 211A. For example, where power distribution system 210 is designed to be configured as shown in FIG. 2, where a particular primary power source 211A is coupled to input 221A and a particular secondary power source 221B is coupled to input 221B, system 292 can determine, based on processing data signals which can originate at one or more of generators 212A-B, 231, etc. whether the input 221A is coupled to power source 211A or a separate power source, including power source 211B. Such an occurrence can occur if the inputs 221A-B of switchgear are mis-wired, due to installation operator error, so that power source 211B is coupled, via line 213B, to input 221A and power source 211A is coupled, via line 213A, to input 221B.

Because each power source 211A-B can include a separate generator 212A-B which generates a particular data signal 214A-B indicating the identity of the respective power source 211, system 292 can determine which power sources 211 are coupled to particular inputs 221. Where the system 292 determines that the configuration of system 210 is a configuration where input 221A is coupled to a power source other than power source 211A, the system can determine that the actual power system configuration of computer system 290 is distinct from a target power system configuration of computer system 290 which specifies that power source 211A is coupled to input 221A. Such a determination can result from the signal 214B from power source 211B passing through line 223A, device 225, and lines 227, 241 to be receives at computer system 290, signals 214A-B being received at generator 231 from specific inputs 221A-B and being communicated 232 to line 227, etc.

As a result, incorrect wiring of various power distribution components in the power distribution system 210 can be detected and corrected. Where power sources 211A-B are configured differently, as noted above in some embodiments, such that power source 211B can supply power to computer system 290 for a reduced period of time as compared with a capability to supply power of power source 211A, detecting a mis-wiring of the power sources 211A-B to the inputs 221A-B can mitigate a risk of unexpected power loss which may result from power source 211B being exhausted or taken offline while switchgear device 225 is configured to supply primary power from line 223A to the computer system 290.

Figure 3:
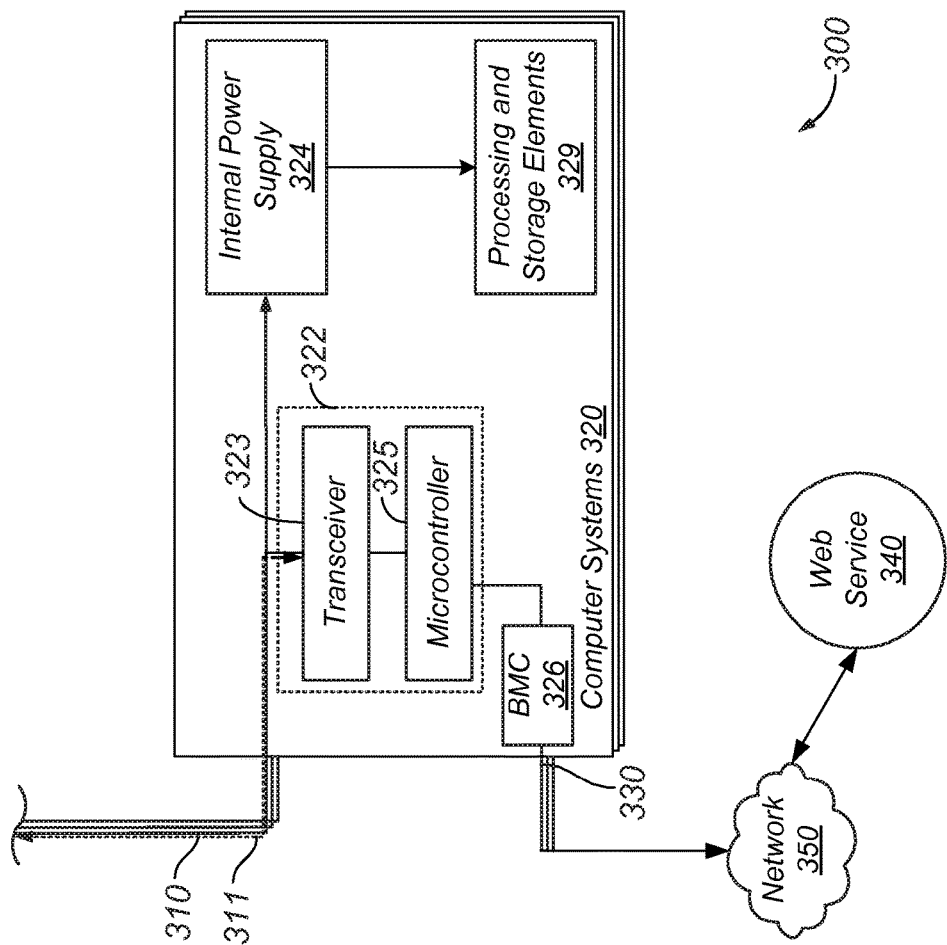
FIG. 3 is a schematic diagram illustrating computer systems which include a power monitoring device which is coupled to a baseboard management controller which is linked to a power monitoring system via a network connection, according to some embodiments.

FIG. 3 is a schematic diagram illustrating computer systems which include a power monitoring device which is coupled to a baseboard management controller which is linked to a power monitoring system via a network connection, according to some embodiments. The computer systems 320 illustrated in FIG. 3 can be included in any embodiments of computer systems included herein.

In some embodiments, a power monitoring system is included within a computer system which is itself included in a set of computer systems. System 300 includes a set of computer systems 320 which are coupled to a set of power transmission lines 310 via which the separate computer systems 320 are supplied power from one or more power distribution systems. Each computer system 320 includes a set of processing and storage elements 329, which can include one or more instances of processing circuitry, memory devices, etc., and one or more internal power supply units 324 which supply power to the elements 329.

As shown, a power monitoring system 322 can be included in a computer system 320 and can include a transceiver 323 which is coupled to the power line 310 which is coupled to the computer system 320 and which supplies power to the internal power supply 324 of the computer system. The transceiver 323 can receive data signals 311 communicated along the power line 310. In some embodiments, including the illustrated embodiment shown in FIG. 3, a power monitoring system 322 includes a microcontroller 325 which is configured to process data signals 311 received at transceiver 323 can generate data output which includes information included in the data signals 311. The output from the microcontroller 325 can be formatted to be readable by one or more external devices, operating systems, etc. In the illustrated embodiment, the power monitoring system 322 included in a computer system 320 is communicatively coupled to a baseboard management controller (BMC) 326 included in the computer system, and the system 322 is configured to communicate processed data from the microcontroller 325 to the BMC 326. The microcontroller can, based on data signals received at transceiver 323, generate data output signals which are formatted to be read by the BMC 326 and are communicated to the BMC 326.

In some embodiments, where the computer system 320 executes a set of computing operations associated with web service 340, BMC 326 can communicate data signal outputs received from the power monitoring system 322 to the web service 340 via network 350.

In some embodiments, a power monitoring system is included in a modular device which can be coupled to a power transmission line which supplies power to a computer system. As a result, the power monitoring system can monitor the power line for data signals, and further monitor the power system configuration of the computer system, without modifying the computer system to include the power monitoring system as an integral part of the computer system.

Figure 4:
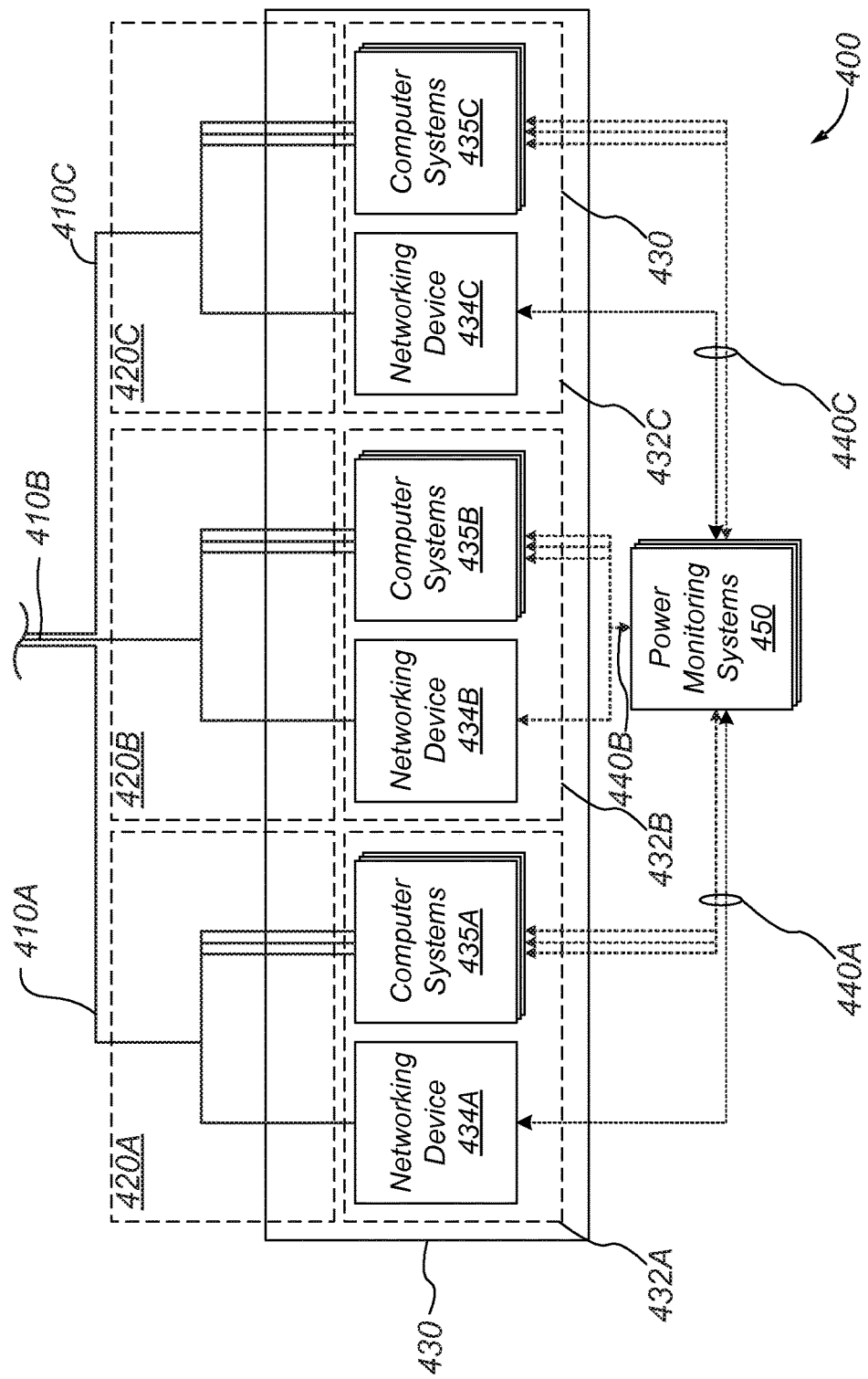
FIG. 4 is a schematic diagram illustrating a power monitoring system which monitors power configurations of multiple sets of computer systems in a rack computer system, according to some embodiments.

FIG. 4 is a schematic diagram illustrating a power monitoring system which monitors power configurations of multiple sets of computer systems in a rack computer system, according to some embodiments. The power monitoring system and rack computer system can be included in any embodiments of power monitoring systems and sets of computer systems, respectively, included herein.

In some embodiments, a rack computer system includes multiple separate sets of computer systems which are each configured to be coupled to one or more power distribution systems via separate commons sets of branch circuitry. A power monitoring system coupled to a set of computer systems can monitor data signals received at the set of computer systems via the branch circuitry and can determine, based on processing the data signals, whether the set of computer systems are being supplied power via a common set of branch circuitry. Certain target power system configurations of a set of computer systems can specify that the set of computer systems are supplied power via a common set of branch circuitry, and a power monitoring system, by determining whether the set of computer systems is actually configured to receive power via a common set of branch circuitry, can verify whether the computer systems are coupled to the common set of branch circuitry in accordance with the target power system configuration of the set of computer systems. In response to a determination that at least some computer systems in a set of computer system are coupled to a separate set of branch circuitry, based on processing data signals received at the various computer systems in the set, the power monitoring system can generate a warning signal which identifies the computer systems coupled to the separate set of branch circuitry and can specify adjustments to the various sets of branch circuitry that, when implemented, result in the set of computer systems being coupled to a common set of branch circuitry in accordance with the target power system configuration which is associated with the set of computer systems.

The system 400 illustrated in FIG. 4 includes a rack computer system 430 which includes three separate sets 432A-C of computer systems. As shown in the illustrated embodiment of FIG. 4, some embodiments of a set 432 of computer systems includes one or more computer systems 435 configured to execute one or more sets of computing operations and one or more networking devices 434 which are configured to communicatively coupled the one or more computer systems 435 in the set 432 to one or more communication networks (not shown in FIG. 4).

As shown, each separate set of computer systems 432A-C is electrically coupled to one or more power distribution systems via a separate set 420A-C of common branch circuitry which is coupled to a separate power line 410A-C. In some embodiments, each separate power line 410A-C carries a separate set of data signals which uniquely identifies power being carried on the respective power line 410. As a result, power being supplied through a given set 420 of branch circuitry can carry a particular set of data signals which uniquely identifies the respective set of branch circuitry.

As shown, the power monitoring system 450 is communicatively coupled, via communication links 440A-C, to the various computer systems 434-435 included in the various sets 432 of computer systems. In some embodiments, the power monitoring system 435 includes one or more power monitoring systems 450 which are included in one or more of the computer systems 434-435. A power monitoring system which is coupled to a set of computer systems 432 can process data signals received at each of various computer systems 434-435 in the set 432 and can determine, based on the processing, whether the set of computer systems is being supplied power via a common set 420 of branch circuitry. If not, the power monitoring system 450 can generate a warning signal which can be communicated to one or more web services associated with the set of computer systems, one or more computer systems associated with a data center operator, etc.

Figure 5:
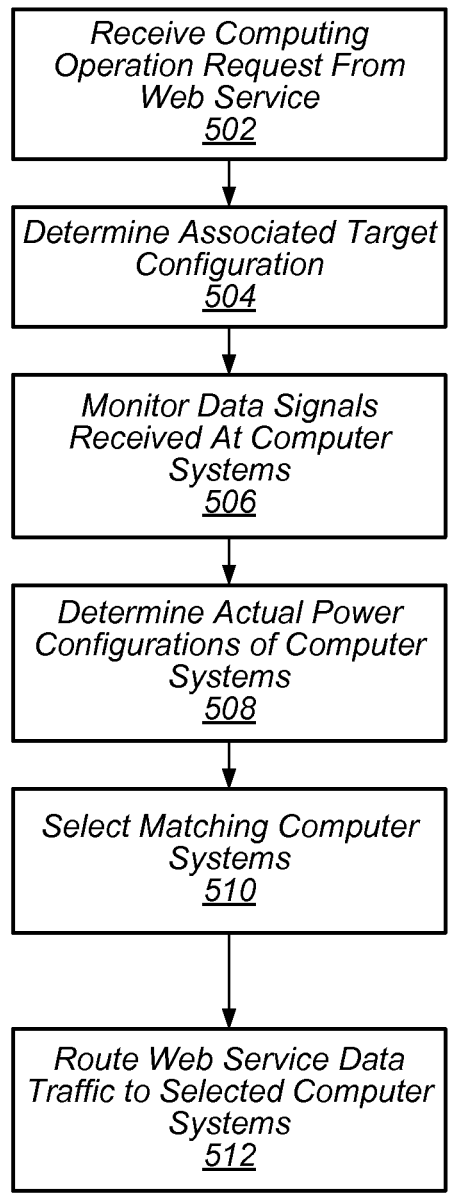
FIG. 5 illustrates routing data traffic to selected computer systems based on monitoring power system configurations of the computer systems, according to some embodiments.

FIG. 5 illustrates routing data traffic to selected computer systems based on monitoring power system configurations of the computer systems, according to some embodiments. The adjustably controlling can be implemented by any embodiments of power monitoring systems included herein, which can be implemented by one or more computer systems as described further below.

At 502 a computing operation request is received at a power monitoring system from a web service. The request can include a request to route data traffic associated with a particular set of computing operations, a particular web service, some combination thereof, etc. to one or more computer systems, a request to execute one or more sets of computing operations associated with the web service on one or more computer systems, etc. At 504, a target power system configuration associated with the set of computing operations is determined. The target power system configuration can be specified in the request received from the web service, determined via accessing a database of associations between particular sets of computing operations and particular target power system configurations, etc.

At 506, data signals received at various computer systems from one or more power distribution systems, via power lines which supply power form the one or more power distribution systems to the computer systems, are monitored. At 508, actual power configurations of the computer systems are determined based on processing the received data signals.

At 510, a set of computer systems which have an actual power system configuration which matches the target power system configuration of the set of computing operations associated with the web service are selected. At 512, web service data traffic associated with the set of computing operations is routed to the selected set of computer systems.

Figure 6:
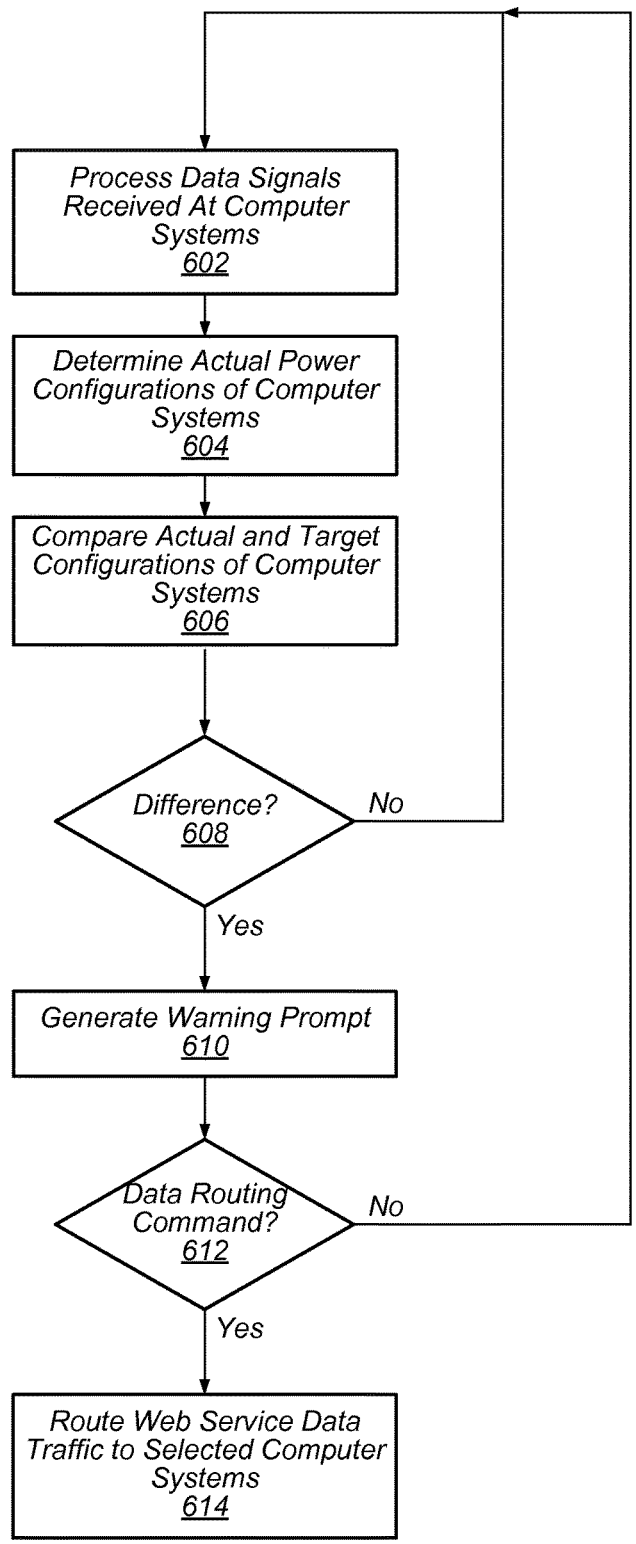
FIG. 6 illustrates monitoring power system configurations of one or more computer systems and adjustably controlling data traffic associated with the computer systems based on the monitoring, according to some embodiments.

FIG. 6 illustrates monitoring power system configurations of one or more computer systems and responding to detected differences between target configurations and actual configurations, according to some embodiments. The monitoring and responding can be implemented by any embodiments of power monitoring systems included herein, which can be implemented by one or more computer systems as described further below.

At 602, one or more sets of data signals received at one or more computer systems are processed. Data signals received at a computer system are received via a power transmission line, including one or more instances of power cabling, via which the computer system receives power from a power distribution system. Data signals can be received at multiple computer systems, and data signals received at multiple computer systems can be processed at a common power monitoring system. In some embodiments, for a given computer system, data signals are received at the computer system via a power monitoring device coupled to the power inlet of the computer system, where the power monitoring device includes a transceiver and microcontroller which is configured to receive and communicate data signals to a baseboard management controller (BMC) of the computer system which further communicates the data signals to a power monitoring system. In some embodiments, a power monitoring system is implemented at one or more computer systems which receive data signals.

At 604, an actual power system configuration of one or more sets of computer systems is determined based on the processed data signals. In some embodiments, the received data signals include information which indicates a configuration of one or more power distribution components in a power distribution system which is supplying power to the computer system, including information indicating a configuration of a switching device, UPS, etc. in the power distribution system. In some embodiments, the received data signals include information which indicate an identity of one or more power sources coupled to one or more power distribution components, including an identity of a power source which supplies primary power to the power distribution system. The indicated configurations of one or more power distribution components can be used to determine an actual power system configuration of the computer system.

In some embodiments, a set of computer systems is determined based on the computing operations executed at the various computer systems included in the set, and a power system configuration of the set of computer systems includes the power system configurations of each of the various computer systems included in the set.

At 606, a determined actual power system configuration of a set of computers is compared with a target power system configuration which is associated with the set of computers. At 608, a determination is made regarding whether the actual power system configuration of the set of computers is different from the target power system configuration of the set of computers. If so, at 610, a warning prompt is generated.

In some embodiments, the determination at 608 includes a determination, if a different between the actual and target power system configurations is determined, of a set of adjustments to the one or more power distribution systems supplying power to the set of computer systems which mitigates the difference, such that the actual power system configuration matches the target power system configuration upon completion of the adjustments. The warning prompt can be communicated to an end-user device, including a computer system, which supports a data center operator and can include instructions to implement the determined set of adjustments.

In some embodiments, where the set of computers comprises a set of computer systems which execute a particular set of computing operations associated with one or more particular web services, the prompt generated at 610 is communicated to the one or more web services and comprises a notification that the actual power system configuration of the set of computer systems differs from the target power system configuration. The target system configuration can be associated with the set of computers based on an assignment of the set of computing operations to the set of computer systems and an association of the set of computing operations with the target power system configuration, such that the prompt 610 comprises a message indicating, to a web service, that the computer systems executing the computing operations associated with the web service are not in compliance with the target power system configuration which is associated with the computing operations.

At 612, a determination is made regarding whether a data routing command is received from the one or more web services. A data routing command can include a command to adjustably control the execution of computing operations on various computer systems to cause the set of computing operations to be executed on a set of computer systems having an actual power system configuration which matches the target power system configuration. Such adjustable controlling can include routing at least some web service data traffic to selected computer systems, where the computer systems are selected based on a determination that routing the web service data traffic to the selected computer systems will result in the set of computing operations to be executed on a set of computer systems having an actual power system configuration which matches the target power system configuration. If such a command is received at 612, the command is executed at 614.

Figure 7:
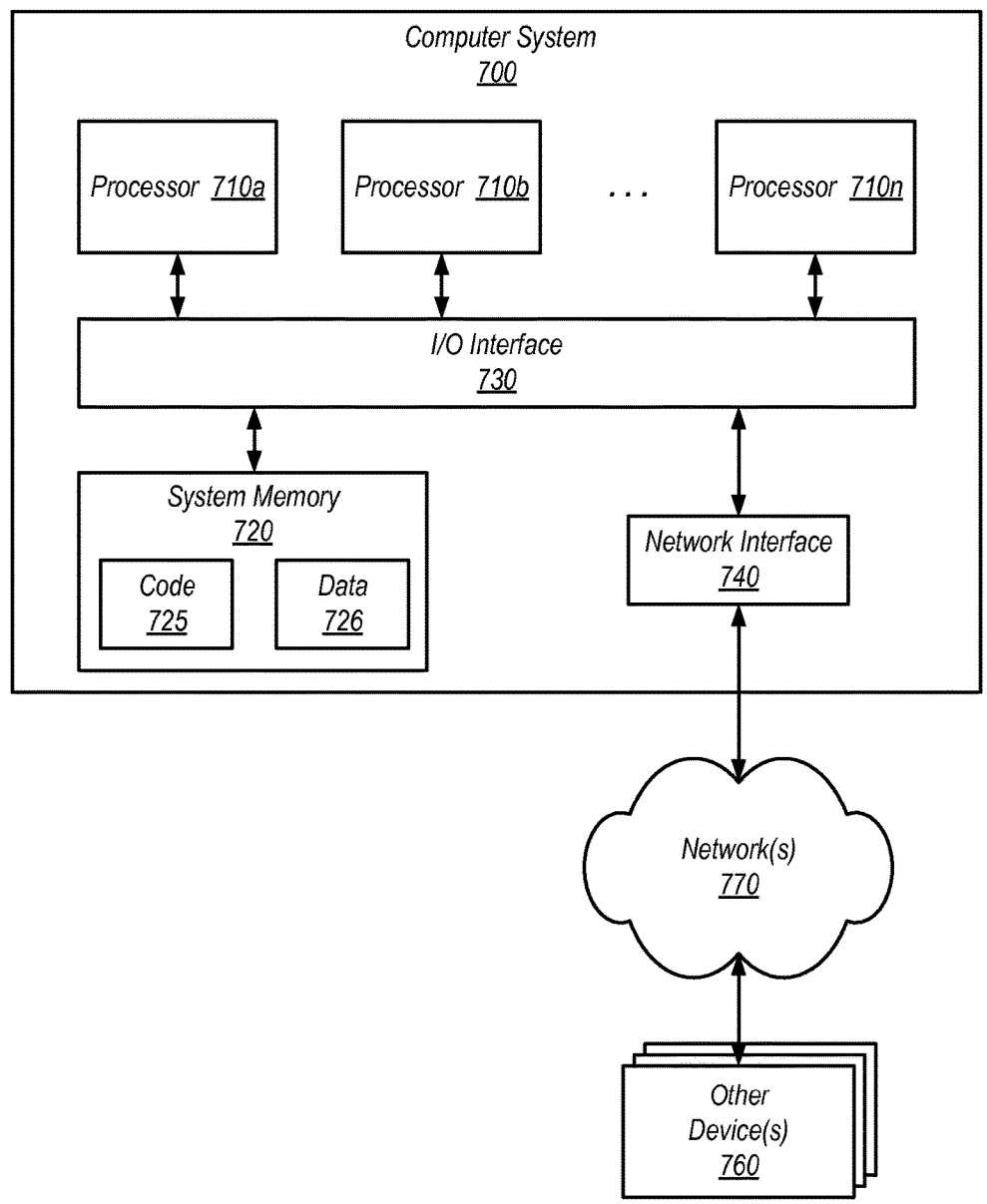
FIG. 7 is a block diagram illustrating an example computer system that may be used in some embodiments.

FIG. 7 is a block diagram illustrating an example computer system that may be used in some embodiments.

In some embodiments, a system that implements a portion or all of one or more of the technologies, including but not limited to a portion or all of apparatuses, methods and systems for power system configuration monitoring, data traffic routing, computing operation control, and various power configuration-based control methods, systems, devices, and apparatuses as described herein, may include a general-purpose computer system that includes or is configured to access one or more computer-accessible media, such as computer system 700 illustrated in FIG. 7. In the illustrated embodiment, computer system 700 includes one or more processors 710 coupled to a system memory 720 via an input/output (I/O) interface 730. Computer system 700 further includes a network interface 740 coupled to I/O interface 730.

In various embodiments, computer system 700 may be a uniprocessor system including one processor 710, or a multiprocessor system including several processors 710 (e.g., two, four, eight, or another suitable number). Processors 710 may be any suitable processors capable of executing instructions. For example, in various embodiments, processors 710 may be general-purpose or embedded processors implementing any of a variety of instruction set architectures (ISAs), such as the x86, PowerPC, SPARC, or MIPS ISAs, or any other suitable ISA. In multiprocessor systems, each of processors 710 may commonly, but not necessarily, implement the same ISA.

System memory 720 may be configured to store instructions and data accessible by processor(s) 710. In various embodiments, system memory 720 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as including but not limited to a portion or all of apparatuses, methods and systems for power system configuration monitoring, data traffic routing, computing operation control, and various power configuration-based control methods, systems, devices, and apparatuses as described herein, are shown stored within system memory 720 as code 725 and data 726.

In one embodiment, I/O interface 730 may be configured to coordinate I/O traffic between processor 710, system memory 720, and any peripheral devices in the device, including network interface 740 or other peripheral interfaces. In some embodiments, I/O interface 730 may perform any necessary protocol, timing or other data transformations to convert data signals from one component (e.g., system memory 720) into a format suitable for use by another component (e.g., processor 710). In some embodiments, I/O interface 730 may include support for devices attached through various types of peripheral buses, such as a variant of the Peripheral Component Interconnect (PCI) bus standard or the Universal Serial Bus (USB) standard, for example. In some embodiments, the function of I/O interface 730 may be split into two or more separate components, such as a north bridge and a south bridge, for example. Also, in some embodiments some or all of the functionality of I/O interface 730, such as an interface to system memory 720, may be incorporated directly into processor 710.

Network interface 740 may be configured to allow data to be exchanged between computer system 700 and other devices 760 attached to a network or networks 750, such as other computer systems or devices as illustrated in FIGS. 1 through 6, for example. In various embodiments, network interface 740 may support communication via any suitable wired or wireless general data networks, such as types of Ethernet network, for example. Additionally, network interface 740 may support communication via telecommunications/telephony networks such as analog voice networks or digital fiber communications networks, via storage area networks such as Fibre Channel SANs, or via any other suitable type of network and/or protocol.

In some embodiments, system memory 720 may be one embodiment of a computer-accessible medium configured to store program instructions and data for implementing embodiments of control methods as described above relative to FIGS. 1-6. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 700 via I/O interface 730. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computer system 700 as system memory 720 or another type of memory. Further, a computer-accessible medium may include transmission media or signals such as electrical, electromagnetic, or digital signals, conveyed via a communication medium such as a network and/or a wireless link, such as may be implemented via network interface 740.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
   a power distribution system configured to supply electrical power from a selected one of a plurality of power sources, wherein the power distribution system comprises:
   a primary power source that includes a primary power source signal generator configured to generate a primary power source data signal uniquely associated with the primary power source;
   a secondary power source that includes a secondary power source signal generator configured to generate a secondary power source data signal uniquely associated with the secondary power source;
   at least one power distribution component configured to selectively supply power from a selected one of the primary power source and the secondary power source; and
   a power transmission line configured to carry the selectively supplied power;
   wherein the power distribution system is configured to communicate one or more data signals, including at least one of the primary power source data signal or the secondary source data signal, the one or more data signals indicating a configuration of one or more portions of the power distribution system, via the power transmission line;
   one or more sets of computer systems configured to consume electrical power supplied by the power distribution system via the power transmission line and to execute one or more sets of computing operations based at least in part upon the consumed electrical power; and
   one or more power monitoring systems, electrically coupled to the power transmission line, which are configured to:
   determine that an actual configuration of the power distribution system supplying power to the one or more sets of computer systems is distinct from a target configuration, of the power distribution system, which is associated with the one or more sets of computer systems, wherein the determination is based at least in part on processing the data signals communicated downstream from the power distribution system via the power transmission line.

2. The data center of claim 1, wherein:
the one or more sets of computer systems are each associated with at least one particular set of computing operations, such that the one or more sets of computer systems execute the at least one particular set of computing operations, based at least in part upon a particular set of data traffic which is routed to the one or more sets of computer systems;
the at least one particular set of computing operations is associated with the target configuration, such that the target configuration specifies a required configuration of power distribution systems which supply power to one or more sets of computer systems which execute the at least one particular set of computing operations;
the one or more power monitoring systems are configured to associate the target configuration with the one or more sets of computer systems based on a determination that the one or more sets of computer systems are executing the at least one particular set of computing operations; and
the one or more power monitoring systems are configured to adjustably control computing operation execution on the one or more sets of computer systems based on determining that the actual configuration of the power distribution system supplying power to the one or more sets of computer systems is distinct from the target configuration which is associated with the at least one particular set of computing operations executed by the one or more sets of computer systems.

3. The data center of claim 1, wherein:
the power distribution component comprises an automatic transfer switch (ATS) which comprises:
a primary power input which is configured to carry primary power received from a coupled power source, a secondary power input which is configured to carry secondary power received from a separate coupled power source; and a power output which is coupled to the power transmission line and is configured to selectively supply, to the power transmission line, power received at a selected one of the primary power input and the secondary power input;

the data signals include information indicating an identity of at least a power source coupled to the primary power input; and determining that the actual configuration is distinct from the target configuration includes at least determining, based on processing data signals received via the power transmission line, that the primary power input is coupled to a power source which is distinct from the primary power source.

4. The data center of claim 1, wherein:

the one or more sets of computer systems comprise at least one set of computer systems and at least one networking device which is configured to communicatively couple the at least one set of computer systems to a communication network;

the target configuration which is associated with the one or more sets of computer systems specifies that the at least one set of computer systems and the at least one networking device are required to be configured to receive power from the power distribution system via a common set of branch circuits; and the one or more power monitoring systems, to determine that the actual configuration is distinct from the target configuration, are configured to determine, based on processing data signals received at the at least one set of computer systems and the at least one networking device, that the at least one networking device and the at least one set of computer systems are receiving power via separate sets of branch circuits.

5. A system, comprising:

a power monitoring system, implemented on one or more computer systems, which is configured to:

associate a target power system configuration with at least one computer system, wherein the target power system configuration specifies a target configuration of at least one power distribution system that supplies power to the at least one computer system via a power transmission line, wherein the at least one power distribution system comprises a primary power source and a secondary power source; and determine that an actual power system configuration of the at least one computer system, wherein the actual power system configuration specifies an actual configuration of the at least one power distribution system, is distinct from the target power system configuration of the at least one computer system, based on processing at least one data signal received at the at least one computer system via the power transmission line, wherein the at least one data signal processed includes one of a primary power source data signal uniquely associated with the primary power source or a secondary power source data signal uniquely associated with the secondary power source.

6. The system of claim 5, wherein:

the at least one computer system is associated with a particular set of computing operations, such that the at least one computer system executes the particular set of computing operations;

the particular set of computing operations is associated with the target power system configuration, such that the particular target power system configuration specifies a required configuration of power distribution systems which supply power to computer systems which execute the particular set of computing operations; and the power monitoring system is configured to associate the target power system configuration with the at least one computer system based on a determination that the at least one computer system is executing the particular set of computing operations.

7. The system of claim 6, wherein:

the power monitoring system is configured to adjustably control execution of the particular set of computing operations by the at least one computer system based on determining that the actual power system configuration of the at least one computer system is distinct from the target power system configuration, of the at least one computer system, which is associated with the particular set of computing operations.

8. The system of claim 7, wherein:

to adjustably control execution of the particular set of computing operations by the at least one computer system, the power monitoring system is configured to execute at least one of:

migrating one or more instances of data associated with the particular set of computing operations from the at least one computer system to at least one other computer system; or routing data traffic associated with the particular set of computing operations away from the at least one computer system and to at least one other computer system.

9. The system of claim 6, wherein:

the at least one computer system comprises a set of computer systems, such that the power monitoring system is configured to associate a target power system configuration with the set of computer systems and is further configured to determine an actual power system configuration of the set of computer systems based on processing data signals received at one or more separate computer systems, of the set of computer systems, via separate power transmission lines;

the set of computer systems are associated with a common set of computing operations, such that separate computing operations associated with the common set of computing operations are executed by separate computer systems included in the set of computer systems;

the target power system configuration specifies that the separate computing operations are executed by separate computer systems which are each included in separate availability zones, such that the separate computer systems are supplied electrical power from separate power distribution systems which supply primary power to the separate computer systems from separate primary power sources; and determining that the actual power system configuration is distinct from the target power system configuration comprises determining that the separate computer systems are electrically coupled to at least one power distribution system, which supplies primary power to the separate computer systems from a common primary power source.

10. The system of claim 9, wherein:

the power monitoring system is configured to, based on determining that the actual power system configuration is distinct from the target power system configuration, migrate at least one computing operation associated with the common set of computing operations from at least one computer system of the set of computer systems to another computer system which is determined to be included in a separate availability zone, such that at least two computing operations of the common set of computing operations are executed by separate computer systems which are each supplied primary power from separate primary power sources via separate power distribution systems.

11. The system of claim 5, wherein the power monitoring system is configured to:
generate, based on determining that the actual power system configuration is distinct from the target power system configuration, a warning message which identifies a set of alterations to at least one power distribution component, included in the at least one power distribution system, which results in adjusting the actual power system configuration of the at least one computer system to match the target power system configuration of the at least one computer system.

12. The system of claim 5, wherein:
the at least one power distribution system comprises an automatic transfer switch (ATS), which is configured to selectively supply power to the at least one computer system from at least one of a plurality of power sources, wherein the ATS comprises:
  a primary power input, which is configured to supply, as primary power, power received from a primary power source, and
  a secondary power input, which is configured to supply, as secondary power, power received power from a secondary power source;
the target power system configuration specifies that the ATS is configured to supply primary power to the at least one computer system from a particular primary power source, which is coupled to the primary power input; and
determining that the actual power system configuration is distinct from the target power system configuration comprises determining, based on processing data signals received at the at least one computer system, that the ATS is configured to supply primary power from a power source that is coupled to the primary power input and that is distinct from the particular primary power source.

13. The system of claim 12, wherein:
the target power system configuration further specifies that the ATS is configured to supply secondary power from a particular secondary power source, which is coupled to the secondary power input; and
determining that the actual power system configuration is distinct from the target power system configuration further comprises determining that the ATS is configured to supply primary power to the at least one computer system from the particular secondary power source, which is coupled to the primary power input and that the ATS is further configured to supply secondary power to the at least one computer system from the particular primary power source, which is coupled to the secondary power input.

14. The system of claim 5, wherein:
the one or more computer systems on which the power monitoring system is implemented comprises the at least one computer system.

15. A method, comprising:
performing, by one or more computer systems:
  associating a target power system configuration with at least one computer system, wherein the target power system configuration specifies a target configuration of at least one power distribution system, which supplies power to the at least one computer system via a power transmission line; and
  determining that an actual power system configuration of the at least one computer system, wherein the actual power system configuration specifies an actual configuration of the at least one power distribution system, is distinct from the target power system configuration of the at least one computer system, based on processing at least one data signal received at the at least one computer system via the power transmission line, wherein the at least one data signal processed includes one of a primary power source data signal uniquely associated with a primary power source or a secondary power source data signal uniquely associated with a secondary power source.

16. The method of claim 15, wherein:
the at least one computer system is associated with a particular set of computing operations, such that the at least one computer system executes the particular set of computing operations;
the particular set of computing operations is associated with the target power system configuration, such that the particular target power system configuration specifies a required configuration of power distribution systems, which supply power to computer systems that execute the particular set of computing operations; and
the method comprises associating the target power system configuration with the at least one computer system based on a determination that the at least one computer system is executing the particular set of computing operations.

17. The method of claim 16, comprising:
adjustably controlling execution of the particular set of computing operations by the at least one computer system based on determining that the actual power system configuration of the at least one computer system is distinct from the target power system configuration, of the at least one computer system, which is associated with the particular set of computing operations.

18. The method of claim 17, wherein:
adjustably controlling execution of the particular set of computing operations by the at least one computer system comprises at least one of:
  migrating one or more instances of data associated with the particular set of computing operations from the at least one computer system to at least one other computer system; or
  routing data traffic associated with the particular set of computing operations away from the at least one computer system and to at least one other computer system.

19. The method of claim 15, comprising:
generating, based on determining that the actual power system configuration is distinct from the target power system configuration, a warning message which identifies a set of alterations to at least one power distribution component, included in the at least one power distribution system, which results in adjusting the actual power system configuration of the at least one computer system to match the target power system configuration of the at least one computer system.

20. The method of claim 15, wherein:

the at least one power distribution system comprises an automatic transfer switch (ATS) which is configured to selectively supply power to the at least one computer system from at least one of a plurality of power sources, wherein the ATS comprises:
- a primary power input, which is configured to supply, as primary power, power received from a primary power source, and
- a secondary power input, which is configured to supply, as secondary power, power received power from a secondary power source;

the target power system configuration specifies that the ATS is configured to supply primary power, to the at least one computer system, from a particular primary power source; and determining that the actual power system configuration is distinct from the target power system configuration comprises determining, based on processing data signals received at the at least one computer system, that the ATS is configured to supply primary power from a power source that is distinct from the particular primary power source.

* * * * *